(12) United States Patent
Choi

(10) Patent No.: US 8,009,160 B2
(45) Date of Patent: Aug. 30, 2011

(54) CIRCUIT FOR TIMING CONTROLLER

(75) Inventor: Jae-Kwon Choi, Gyeongsangbuk-do (KR)

(73) Assignee: LG Display Co. Ltd., Seoul (KR)

( * ) Notice: Subject to any disclaimer, the term of this patent is extended or adjusted under 35 U.S.C. 154(b) by 1003 days.

(21) Appl. No.: 11/824,493

(22) Filed: Jun. 28, 2007

(65) Prior Publication Data

US 2007/0279409 A1   Dec. 6, 2007

Related U.S. Application Data

(62) Division of application No. 10/716,275, filed on Nov. 18, 2003, now Pat. No. 7,256,778.

(30) Foreign Application Priority Data

Dec. 23, 2002 (KR) .............. 10-2002-082724

(51) Int. Cl.
*G09G 5/00* (2006.01)
(52) U.S. Cl. ....................... 345/213; 345/214
(58) Field of Classification Search ............ 345/98, 345/100, 211–213; 327/141–143, 50, 198, 327/545
See application file for complete search history.

(56) References Cited

U.S. PATENT DOCUMENTS

| | | | |
|---|---|---|---|
| 5,850,216 A | 12/1998 | Kwon | |
| 6,418,002 B1 | 7/2002 | Yang et al. | |
| 6,894,673 B2 | 5/2005 | Koga et al. | |
| 7,256,778 B1 * | 8/2007 | Choi | 345/213 |
| 2002/0089484 A1 | 7/2002 | Ahn | |
| 2004/0100435 A1 | 5/2004 | Baek et al. | |

FOREIGN PATENT DOCUMENTS

| | | |
|---|---|---|
| JP | 02-189021 | 7/1990 |
| JP | 05-002268 | 1/1993 |
| JP | 08-191240 | 7/1996 |
| JP | 08-331488 | 12/1996 |
| JP | 11-017509 | 1/1999 |
| JP | 11-249613 | 9/1999 |
| JP | 2001-100175 | 4/2001 |

OTHER PUBLICATIONS

Office Action for corresponding Japanese Application No. 2003-420626.

* cited by examiner

*Primary Examiner* — Kevin M Nguyen
*Assistant Examiner* — Kenneth B Lee, Jr.
(74) *Attorney, Agent, or Firm* — Brinks Hofer Gilson & Lione

(57) ABSTRACT

A reset circuit of a timing controller includes: a transistor including an emitter connected to a first node, a base connected to a second node and a collector connected to a third node, a digital input voltage (DVCC) being applied to the first node; a first resistor connected between the first and second nodes; a second resistor connected between the second node and a fourth node, the fourth node being grounded; a third resistor connected between the third and fourth nodes; a fourth resistor connected between the third node and a fifth node, the fifth node being connected to an input terminal of the timing controller; and a capacitor including a first electrode connected to the fifth node and a second electrode grounded.

3 Claims, 8 Drawing Sheets

CIRCUIT FOR TIMING CONTROLLER

This application is a divisional application and claims the benefit pursuant to 35 U.S.C. §121 of U.S. application Ser. No. 10/716,275 filed on Nov. 18, 2003 now U.S. Pat. No. 7,256,778, which has been allowed is and is hereby incorporated in its entirety by reference. This application also claims the benefit of priority to Korean Patent Application No. 2002-082724 filed Dec. 23, 2002 herein incorporated in its entirety by reference.

BACKGROUND OF THE INVENTION

1. Field of the Invention

The present invention relates to a liquid crystal display device, and more particularly, to a reset circuit for a timing controller that includes a unit preventing a voltage-induction phenomenon due to Low Voltage Differential Signaling (LVDS).

2. Discussion of the Related Art

Recently, flat panel displays (FPDs) are being developed to have a high frequency and a high resolution for achieving a higher display quality. Among various types of FPDs, liquid crystal display (LCD) devices have been the subject of recent researches. In the LCD devices, since a data signal and a clock signal are transmitted through a transistor-transistor logic (TTL) signal having a high frequency, a voltage level of image signals is shifted to correspond to the high frequency of the TTL signal. The shift of the voltage level causes an electromagnetic interference (EMI) problem. Moreover, since a large number of transmission paths are necessary to transmit the data signal and the clock signal through the TTL signal, a large number of cables and connectors are required to the LCD devices. Accordingly, the data signal and the clock signal are directly or indirectly influenced by an external noise, thereby images may be abnormally displayed. In addition, a number of data transmission bits supported by a graphic controller for achieving a full color high resolution is restricted.

To solve such a problem, a low voltage differential signal (LVDS) specification for an interface between a main body of a computer and an LCD device has been proposed. The LVDS specification is a new data interface standard that is defined in the IEEE 1596.3 standards. It is essentially a signaling method used for a low-voltage and high-speed data transmission. In general, the LVDS technology provides a narrow band high-speed interface between an LCD device mounted in a notebook computer and a graphic controller of a motherboard, or uses a cable to a monitor of a desktop computer.

FIG. 1 is a schematic block diagram showing a connection between a main body of a computer and a liquid crystal display device according to the related art.

In FIG. 1, a graphic card 12 is provided in a main body of a computer as a signal source. The graphic card 12 supplies a color signal of a TTL level including red (R), green (G) and blue (B) signal components, and a plurality of control signals to first and second LVDS transmitting units 14 and 16. To display color images in a line inversion method or a dot inversion method according to a physical characteristic of a liquid crystal, the R, G and B signals are respectively supplied to the first and second LVDS transmitting units 14 and 16 with opposite polarities. A control signal including a horizontal sync signal component, a vertical sync signal component and a data enable (DE) signal component is supplied to the first LVDS transmitting unit 14.

Each signal supplied to the first and second LVDS transmitting units 14 and 16 is converted into an LVDS, and the LVDS is transmitted to a liquid crystal display (LCD) device 60 through a plurality of channels. First and second LVDS receiving units 18 and 20 of the LCD device 60 receive the LVDS transmitted through the plurality of channels. The first and second LVDS receiving units 18 and 20 convert the LVDS into a TTL signal and send the TTL signal to a timing controller 22. The timing controller 22 generates control signals of TTL levels for an LCD module 24 and determines a timing format of the control signals and the R, G and B signals. The control signals and the R, G and B signals in the timing format are supplied to the LCD module 24.

The LCD module 24 includes a source driver (not shown), a gate driver (not shown) and an LCD panel (not shown). The source driver and the gate driver are loaded on a printed circuit board (PCB) and the PCB is connected to the LCD panel. The R, G and B signals and some control signals are applied to the source driver and the other control signals are applied to the gate driver. The LCD panel includes a thin film transistor (TFT) (not shown) in each pixel region. The TFT is turned ON or OFF according to a switching pulse outputted from the gate driver. A data signal from the source driver is applied to the pixel region where the TFT is turned ON and a liquid crystal layer of the pixel region is driven to be transparent.

In FIG. 2, a first electrostatic protection circuit 28 is connected to an LVDS transmitting unit 14 and a second electrostatic protection circuit 28 to an LVDS receiving unit 18 of a timing controller 22. The timing controller 22 includes a reset circuit 30 to enable a specific signal such as source control signals (SSC, SOE, SSP) and gate control signals (GSC, GOE, GSP). The timing controller 22 may include a plurality of LVDS receiving units 18 and a plurality of reset circuits 30. When an input voltage "Vin" (not shown) for the entire circuit is not applied, i.e., a resource voltage of about 3.3 V is not applied to each DVCC node of the electrostatic protection circuit 28 and the reset circuit 30, an LVDS voltage of about 1.4 V (±several hundreds mV) outputted from the LVDS transmitting unit 14 is inputted to the timing controller 22 through the second electrostatic protection circuit 28.

In FIG. 3, a graphical view shows an LVDS voltage outputted from the LVDS transmitting unit when a resource voltage is not applied to each DVCC node of an electrostatic protection circuit and a reset circuit according to the related art.

In FIG. 4, a circuit diagram shows an operation of an electrostatic circuit when an LVDS voltage outputted from the LVDS transmitting unit is inputted to the electrostatic circuit according to the related art. When an LVDS voltage of about 1.4V is inputted to an electrostatic protection circuit, a current flows to a first DVCC node through a forward diode "$D_F$" because a reverse diode "$D_R$" is grounded. Accordingly, the first DVCC node has an induced electrical potential of about 0.3 V to about 0.7 V.

Referring again to FIG. 2, since the first DVCC node of the second electrostatic protection circuit 28 is electrically connected to a second DVCC node of the reset circuit 30, the second DVCC node of the reset circuit 30 also has an induced electrical potential of about 0.3 V to about 0.7 V. When an input voltage "Vin" (not shown) for the entire circuit is applied, i.e., a resource voltage of about 3.3 V is applied to the second DVCC node of the reset circuit 30, a capacitor "C" of the reset circuit 30 is not charged up from 0 V but from about 0.7 V due to the induced electrical potential of about 0.7V by the LVDS voltage of about 1.4 V.

In FIG. 5, a graph represents a GOE signal outputted from a timing controller according to the related art. When the reset circuit 30 (of FIG. 2) enables the source control signals and the gate control signals through the timing controller 22 (of FIG. 2), especially, a GOE (gate operation enable) signal is applied to the gate driver, a duration (GOE mask time) longer than about 16 msec should be obtained for a normal operation of the gate driver. As shown in FIG. 5, however, the GOE signal outputted from the timing controller 22 (of FIG. 2) has a short duration of about 2 msec (indicated with an arrow). The short duration may cause an abnormal operation of the gate driver, thereby the LCD panel may abnormally display images.

In FIG. 6, a graph represents an input voltage and a clock according to the related art, wherein when an input voltage "Vin" is applied to the entire circuit, a clock signal "CLOCK" for a source driver has an undesirable impulse (indicated by the ellipse) causing abnormal images.

SUMMARY OF THE INVENTION

Accordingly, the present invention is directed to a liquid crystal display device and a driving method thereof that substantially obviate one or more of the problems due to limitations and disadvantages of the related art.

An embodiment of the present invention provides a liquid crystal display device including a reset circuit and a timing controller that induce a normal operation of a gate driver and a source driver, and a driving method thereof.

One advantage of the present invention is that it provides a liquid crystal display device that has high reliability by adding a simple circuit, and a driving method thereof.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages, a reset circuit of a timing controller includes: a transistor including an emitter connected to a first node, a base connected to a second node and a collector connected to a third node, a digital input voltage (DVCC) being applied to the first node; a first resistor connected between the first and second nodes; a second resistor connected between the second node and a fourth node, the fourth node being grounded; a third resistor connected between the third and fourth nodes; a fourth resistor connected between the third node and a fifth node, the fifth node being connected to an input terminal of the timing controller; and a capacitor including a first electrode connected to the fifth node and a second electrode grounded.

In another aspect, a circuit for a liquid crystal display device includes: a timing controller including at least one input terminal; a reset circuit connected to the timing controller including: a transistor including an emitter connected to a first node, a base connected to a second node and a collector connected to a third node, a digital input voltage (DVCC) being applied to the first node; a first resistor connected between the first and second nodes; a second resistor connected between the second node and a fourth node, the fourth node being grounded; a third resistor connected between the third and fourth nodes; a fourth resistor connected between the third node and a fifth node, the fifth node being connected to the at least one input terminal; and a capacitor including a first electrode connected to the fifth node and a second electrode grounded; and a filtering circuit connected to the reset circuit, the filtering circuit keeping a GOE mask time of a GOE signal applied to a gate driver of the liquid crystal display device longer than about 16 msec and eliminating an impulse of a clock signal applied to a source driver of the liquid crystal display device.

In another aspect, a liquid crystal display device includes: an LCD module including a gate driver and a source driver; a timing controller supplying a GOE (gate operation enable) signal to the gate driver and a clock signal to the source driver, the timing controller including an electrostatic protection circuit; a reset circuit supplying a reset signal to the timing controller, the reset signal enabling the GOE signal; and a filtering circuit connected to the reset circuit, the filtering circuit keeping a GOE mask time of the GOE signal longer than about 16 msec and reducing an impulse of the clock.

One method devised for increasing reliability in a liquid crystal display device is, for example, to supply an operation signal to a first driver of the liquid crystal display device and a timing signal to a second driver of the liquid crystal display device. Further, an additional signal is supplied to a controller to enable the operation signal, and then filtered to permit a masking of the operation signal for a time duration compatible with inducing a first driver operation involving substantially reduced image interferences, and to reduce an impulse of the timing signal.

In the above-described method of increasing reliability in the liquid crystal display device, the time duration of the masking of the operational signal may be longer than about 16 msec.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE EMBODIMENTS

Reference will now be made in detail to embodiments of the present invention, examples of which are illustrated in the accompanying drawings.

Figure 7:
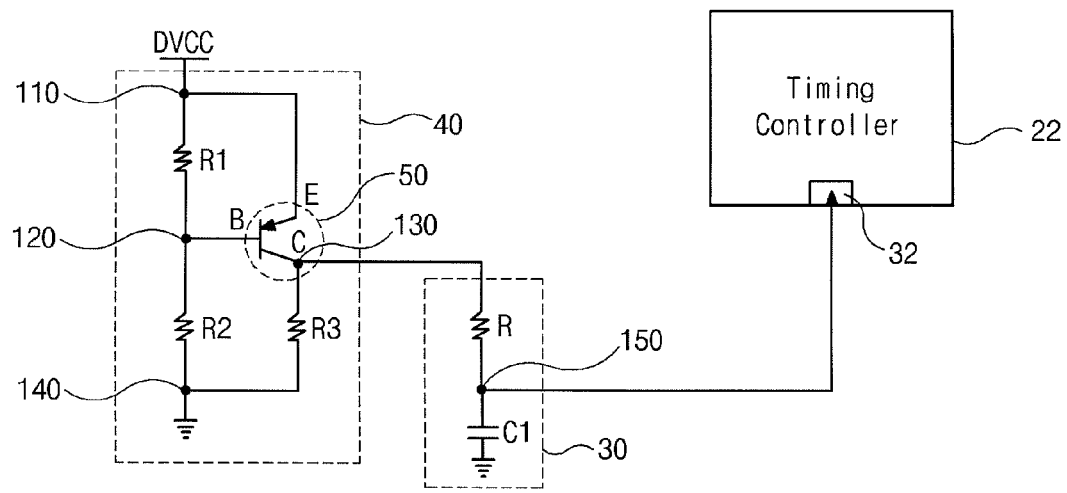
FIG. 7 is a schematic circuit diagram illustrating a timing controller and a reset circuit of a liquid crystal display device according to an embodiment of the present invention.

FIG. 7 is a schematic circuit diagram showing a timing controller and a reset circuit of a liquid crystal display device according to an embodiment of the present invention.

In FIG. 7, a timing controller 22 includes at least one input terminal 32 of a reset signal. To obtain a GOE mask time duration longer than about 16 msec of a GOE signal applied to a gate driver and eliminate an impulse of a clock signal applied to a source driver, a filtering circuit 40 is connected to a reset circuit 30. The filtering circuit 40 includes a bipolar thin film transistor (TFT) 50, and first to third resistors "R1," "R2" and "R3." The bipolar TFT 50 of PNP type or NPN type includes a base "B," an emitter "E" and a collector "C" as electrodes. The emitter "E" is connected to a first node 110, the base "B" is connected to a second node 120, and the collector "C" is connected to a third node 130. A fourth node 140 is grounded. The first resistor "R1" is connected between the first and second nodes 110 and 120, and the second resistor "R2" is connected between the second and fourth nodes 120 and 140, and the third resistor "R3" is connected between the third and fourth nodes 130 and 140. The first node 110 is a DVCC node and the third node 130 is connected to a reset circuit 30 which includes a resistor "R" and a capacitor "C1." The first, second and third resistors, "R1," "R2" and "R3", have a resistance ratio of substantially 100:51:1. For example, the first, second and third resistors "R1," "R2" and "R3" have a resistance of 100 kΩ, 51 kΩ and 1 kΩ, respectively.

Figure 1:
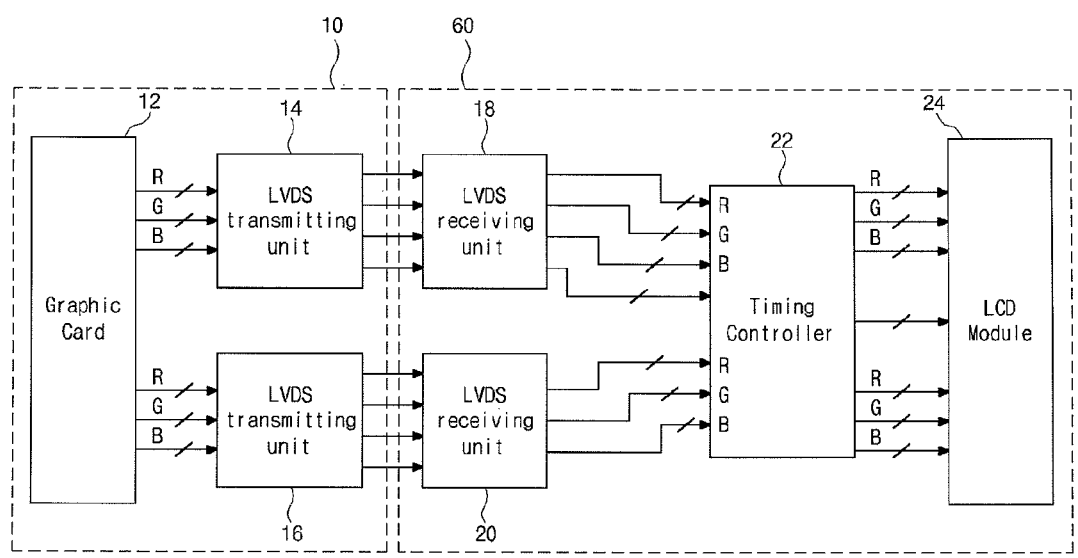
FIG. 1 is a schematic block diagram illustrating an embodiment connection between a main body of a computer and a liquid crystal display device according to the related art.
Figure 2:
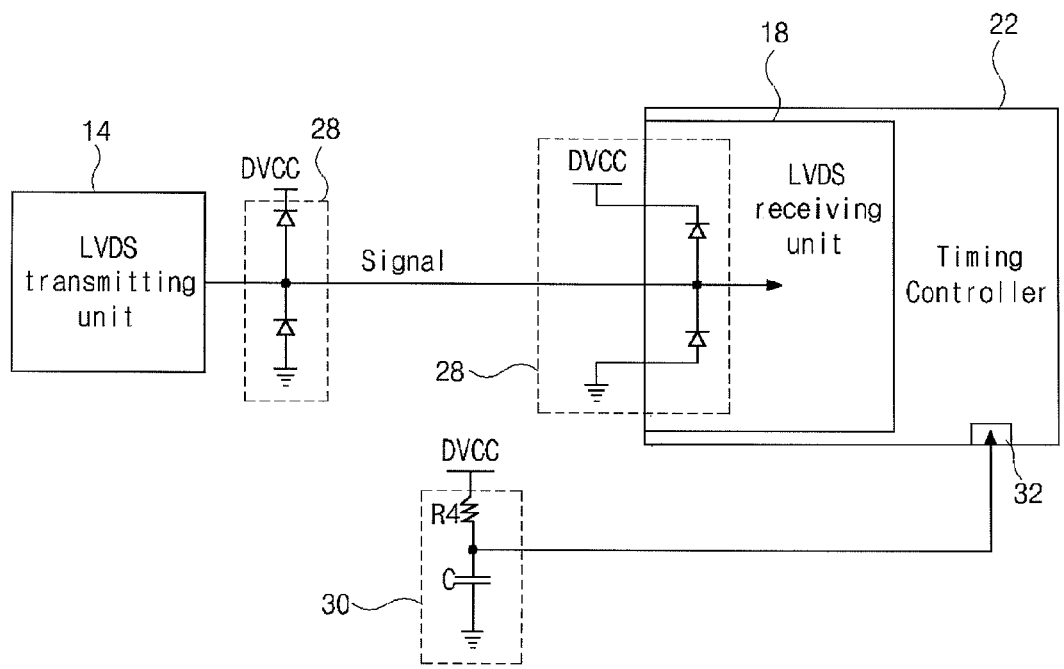
FIG. 2 is a schematic block diagram illustrating an embodiment connection between a timing controller, a LVDS transmitting unit, and a LVDS receiving unit according to the related art.
Figure 3:
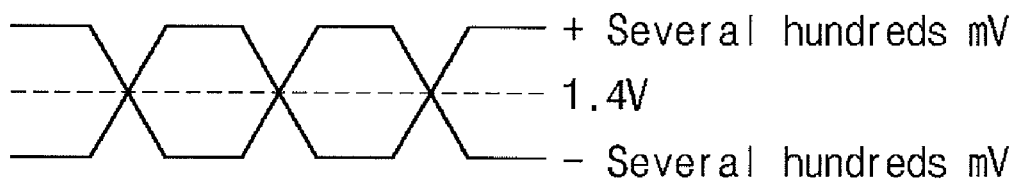
FIG. 3 illustrates a graph of an LVDS voltage outputted from the LVDS transmitting unit when a resource voltage is not applied to each DVCC node of an electrostatic protection circuit and a reset circuit according to the related art.
Figure 4:
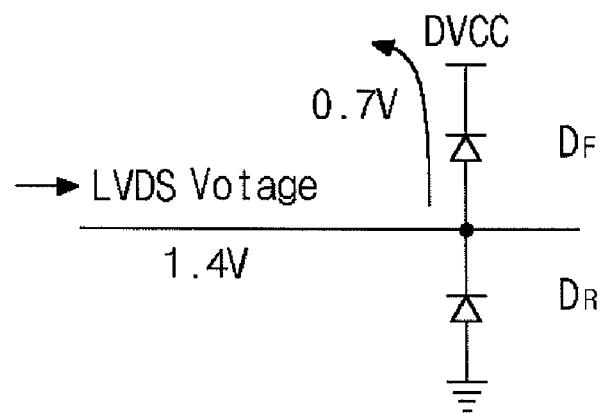
FIG. 4 is a circuit diagram illustrating an operational embodiment of an electrostatic circuit when an LVDS voltage outputted from the LVDS transmitting unit is inputted to the electrostatic circuit according to the related art.
Figure 5:
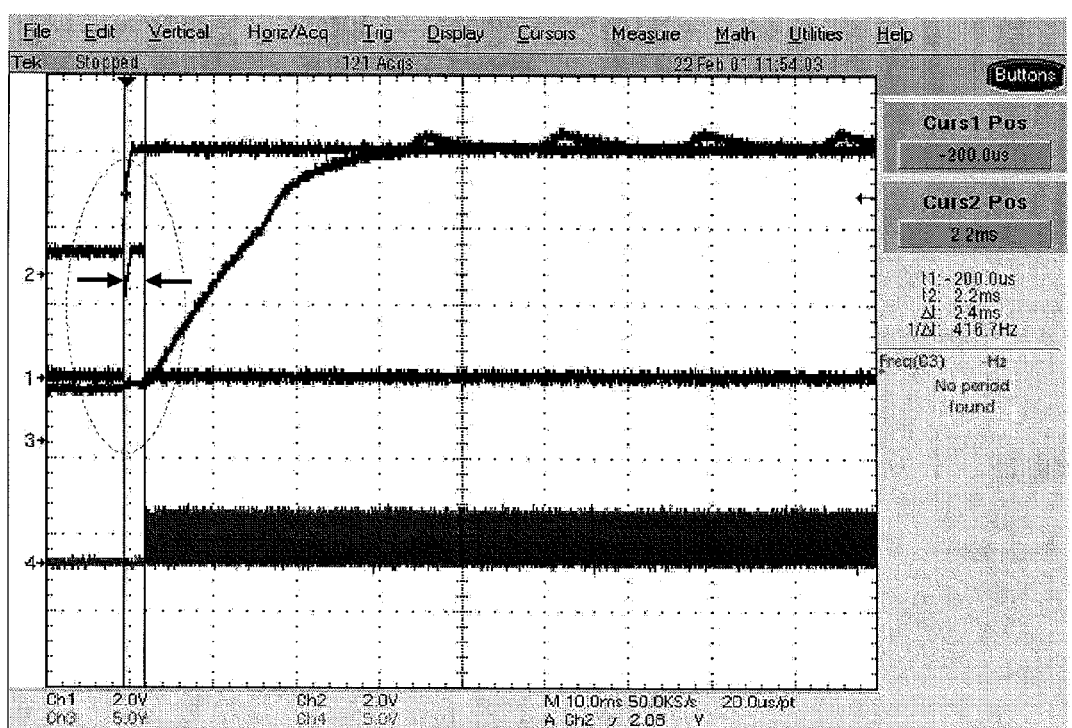
FIG. 5 illustrates a graph of a GOE signal outputted from a timing controller according to the related art.
Figure 6:
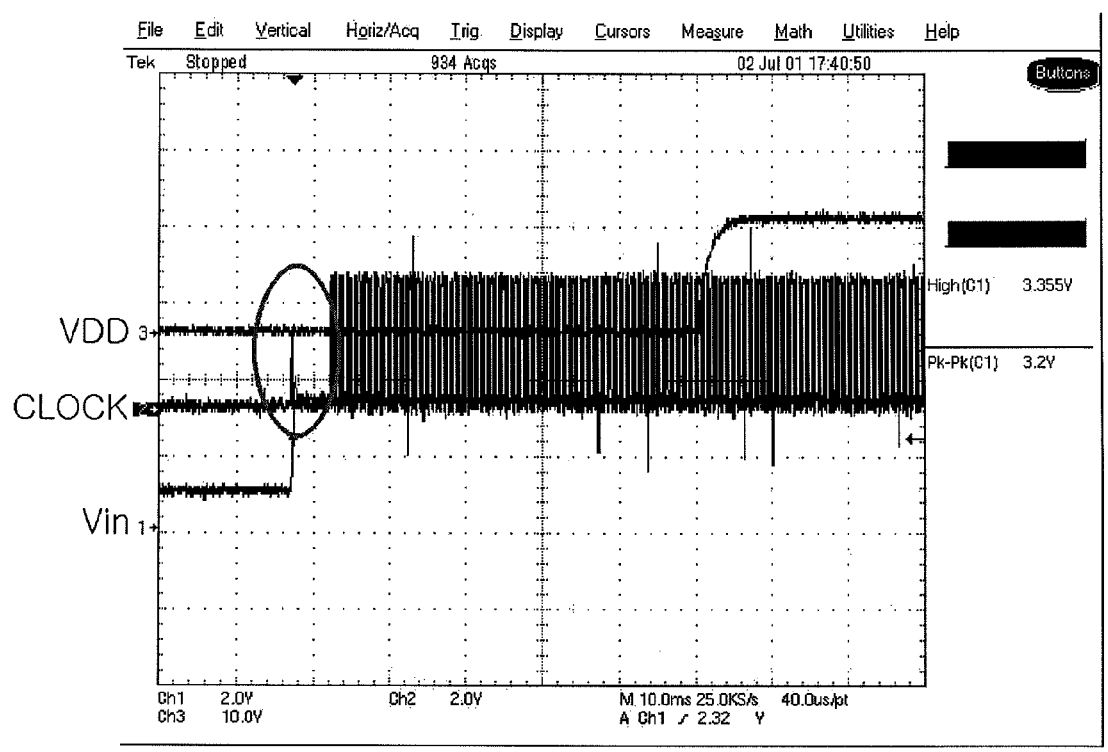
FIG. 6 illustrates a graph of an input voltage and a clock according to the related art.

When an input voltage "Vin" (of FIG. 6) for the entire circuit is not applied, i.e., a resource voltage of about 3.3 V is not applied to each DVCC node of an electrostatic protection circuit 28 (of FIG. 2) and the filtering circuit 40, then an LVDS voltage of about 1.4 V (±several hundreds mV) outputted from an LVDS transmitting unit 14 (of FIG. 2) is inputted to a first electrostatic protection circuit 28 (of FIG. 2). Accordingly, a current flows to a first DVCC node through a forward diode "DF" (of FIG. 4) because a reverse diode "DR" (of FIG. 4) is grounded. As a result, the first DVCC node of the first electrostatic protection circuit 28 (of FIG. 2) has an induced electrical potential of about 0.3 V to about 0.7 V. Since the first DVCC node of the first electrostatic protection circuit 28 (of FIG. 2) is electrically connected to a second DVCC node of the filtering circuit 40, the second DVCC node of the filtering circuit 40 also has an induced electrical potential of about 0.3 V to about 0.7 V. When the induced electrical potential of about 0.7 V is applied to the second DVCC node of the filtering circuit 40, a first voltage "V1" of the second node 120 is determined according to a distribution law of voltage as follows.

$$V1 = 0.7\,V \times (51\,k\Omega / (100\,k\Omega + 51\,k\Omega)) = 0.23\,V$$

Since the first voltage "V1" of about 0.23 V is applied to the bipolar TFT 50, the bipolar TFT 50 is turned OFF. Accordingly, the third node 130 has an electrical potential of 0 V and the capacitor "C" "C1" of the reset circuit 30 is not charged up.

When the input voltage "Vin" (of FIG. 6) for the entire circuit is applied, the resource voltage of about 3.3 V is applied to each DVCC node of a first electrostatic protection circuit 28 (of FIG. 2) and the filtering circuit 40. Thus, a second voltage "V2" of the second node 120 is determined according to a distribution law of voltage as follows.

$$V2 = 3.3\,V \times (51\,k\Omega / (100\,k\Omega + 51\,k\Omega)) = 1.11\,V$$

Since the second voltage "V2" of about 1.11 V is applied to the bipolar TFT 50, the bipolar TFT 50 is turned ON. Accordingly, the third node 130 has an electrical potential of 3.3 V and the capacitor "C" "C1" of the reset circuit 30 starts to be charged up. Then, the reset circuit 30 outputs a reset signal to the timing controller 22 through the at least one input terminal 32 of the reset signal.

Figure 8:
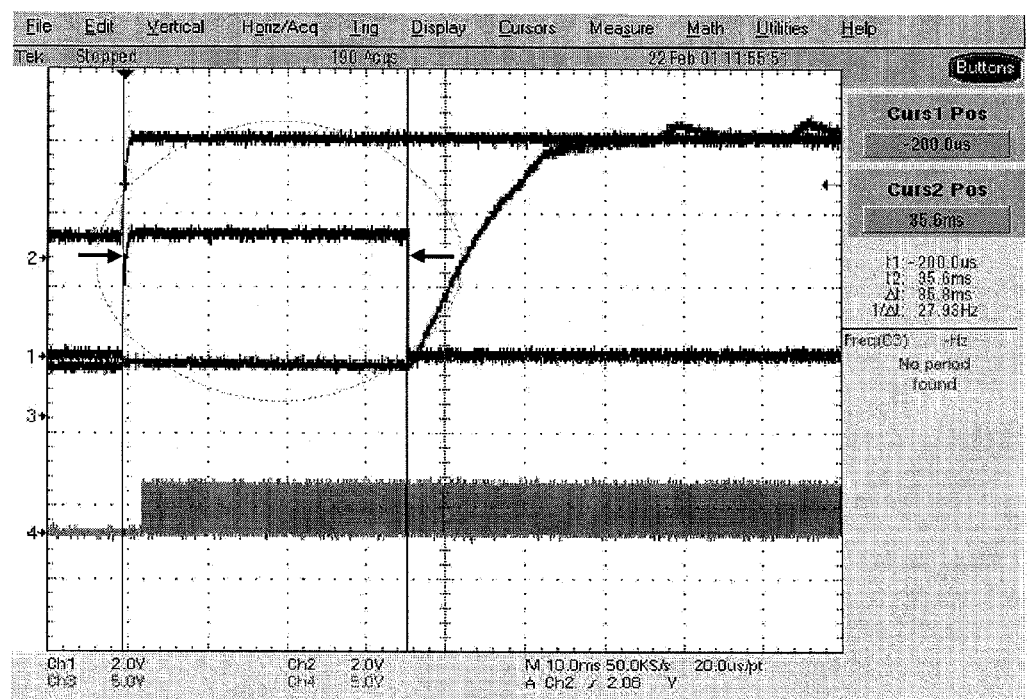
FIG. 8 is a graph illustrating a GOE signal outputted from a timing controller according to an embodiment of the present invention.

In FIG. 8, a GOE signal has a GOE mask time duration (indicated by arrows) of about 35 msec longer than a minimum value of about 16 msec. Accordingly, images are normally displayed.

Figure 9:
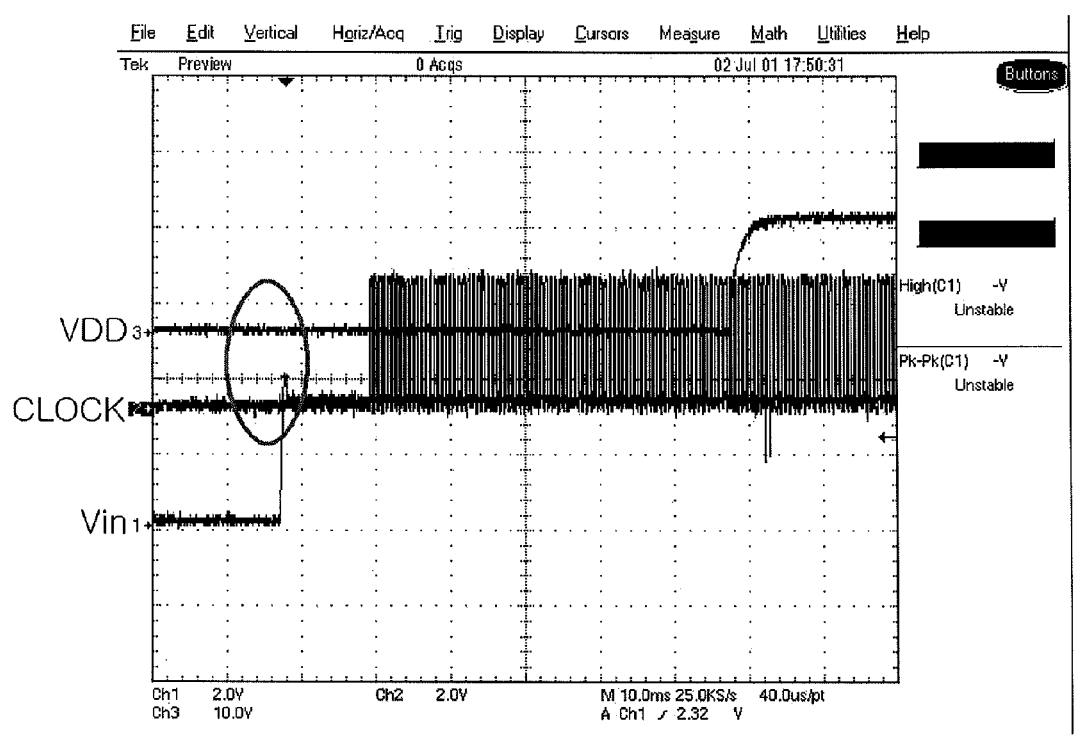
FIG. 9 is a graph illustrating an input voltage and a clock signal according to an embodiment of the present invention.

In FIG. 9, moreover, when an input voltage "Vin" is applied to the entire circuit, an undesirable impulse (indicated by the ellipse) of a clock signal "CLOCK" for a source driver is reduced.

Consequently, a filtering circuit connected to a reset circuit prevents an application of an induced voltage to a DVCC node, thereby a stable duration (GOE mask time) of a GOE signal is obtained and an undesirable impulse of a clock signal is reduced. Therefore, a malfunction of a timing controller is reduced and an LCD device having high display quality is obtained.

It will be apparent to those skilled in the art that various modifications and variations can be made in a liquid crystal display device and a driving method thereof of the present invention without departing from the spirit or scope of the invention. Thus, it is intended that the present invention cover the modifications and variations of this invention provided they come within the scope of the appended claims and their equivalents.

What is claimed is:

1. A circuit for a timing controller, comprising:
   a filtering circuit including a transistor, a first resistor, a second resistor and a third resistor, the transistor including an emitter connected to a first node, a base connected to a second node and a collector connected to a third node, a digital input voltage (DVCC) being applied to the first node, the first resistor connected between the first and second nodes, and the third resistor connected between the third and fourth nodes;
   a reset circuit including a fourth resistor and a capacitor, the fourth resistor connected between the third node and a fifth node, the fifth node being connected to an input terminal of the timing controller, and the capacitor including a first electrode connected to the fifth node and a second electrode that is grounded.

2. The circuit according to claim 1, wherein the transistor is a PNP (positive-negative-positive) type.

3. The circuit according to claim 1, wherein a ratio of the first resistor to the second and third resistors is substantially 100:51:1.

* * * * *